United States Patent
Lee et al.

(10) Patent No.: US 10,611,628 B2
(45) Date of Patent: Apr. 7, 2020

(54) MEMS ISOLATION PLATFORM WITH THREE-DIMENSIONAL VIBRATION AND STRESS ISOLATION

(71) Applicant: EPACK, INC., Ann Arbor, MI (US)

(72) Inventors: Sangwoo Lee, Ann Arbor, MI (US); Jay Mitchell, Ypsilanti, MI (US); Onnop Srivannavit, Ann Arbor, MI (US)

(73) Assignee: EPACK, INC., Ann Arbor, MI (US)

( * ) Notice: Subject to any disclaimer, the term of this patent is extended or adjusted under 35 U.S.C. 154(b) by 56 days.

(21) Appl. No.: 15/393,542

(22) Filed: Dec. 29, 2016

(65) Prior Publication Data

US 2018/0230005 A1    Aug. 16, 2018

(51) Int. Cl.
*B81B 7/00*    (2006.01)
*B81B 3/00*    (2006.01)

(52) U.S. Cl.
CPC .......... *B81B 7/0016* (2013.01); *B81B 3/0051* (2013.01); *B81B 7/0048* (2013.01); *B81B 2201/0235* (2013.01); *B81B 2201/0242* (2013.01)

(58) Field of Classification Search
CPC .... B81B 2201/0228; B81B 2201/0235; B81B 2201/0242; B81B 2201/025; B81B 3/0013; B81B 2203/0163; B81B 7/0016; B81B 7/0048; B81B 3/0051
See application file for complete search history.

(56) References Cited

U.S. PATENT DOCUMENTS

| | | | |
|---|---|---|---|
| 5,484,073 A * | 1/1996 | Erickson | G01P 15/0802 148/DIG. 12 |
| 5,777,226 A * | 7/1998 | Ip | G01P 15/02 73/514.24 |
| 8,896,074 B2 | 11/2014 | Bernstein et al. | |
| 9,227,835 B2 | 1/2016 | Horning et al. | |
| 2012/0130671 A1 | 5/2012 | Horning et al. | |
| 2016/0090297 A1 | 3/2016 | Zhang et al. | |
| 2017/0073215 A1 * | 3/2017 | Bergeron | B81C 1/00182 |

* cited by examiner

*Primary Examiner* — Jose R Diaz
(74) *Attorney, Agent, or Firm* — Brooks Kushman P.C.

(57) ABSTRACT

A microelectromechanical vibration and stress isolation system is provided. The system includes an isolation platform configured to support a transducer and having an outer perimeter. A frame surrounds the isolation platform and has inner edge surfaces that are spaced from and face the outer edge surfaces of the platform. A spring connects the isolation platform to the frame. The spring is generally L-shaped, having a first leg that connects one inner edge surface to an outer edge surface while extending around a corner of the platform.

39 Claims, 5 Drawing Sheets

MEMS ISOLATION PLATFORM WITH THREE-DIMENSIONAL VIBRATION AND STRESS ISOLATION

STATEMENT REGARDING FEDERALLY SPONSORED RESEARCH OR DEVELOPMENT

The invention was made with Government support under Contract Nos. W56KGU14C0021 awarded by the U.S. Army, N0001413C0330 awarded by the U.S. Navy, W911NF-16-C-0093 awarded by the Defense Advanced Research Projects Agency, and IIP-1431016 awarded by the National Science Foundation. The Government may have certain rights to the invention.

TECHNICAL FIELD

This disclosure relates to a vibration and stress isolation system for small devices. More particularly, various embodiments of this disclosure relate to a vibration and stress isolation system for a MEMS device supported on an isolation platform within a packaged micro structure.

BACKGROUND

Microelectromechanical systems (MEMS), gyroscopes, accelerometers, inertial measurement units (IMUs), magnetometers, transducers, and other sensors have recently improved in their speed, accuracy, size, power and cost. In many applications, such as navigation, the output of these sensors is required to be extremely precise. A large contributor to the precision and accuracy of the sensors is their vibration and stress sensitivity. Even the smallest of vibrations and stress to the sensors can impair the extreme accuracy that is desired in these sensors.

Attempts have been made to dampen vibration for MEMS devices. For example, U.S. Pat. No. 8,896,074 teaches a microelectromechanical vibration isolation system having a plurality of fin apertures etched through a microelectromechanical structure, and a plurality of fins each disposed within a respective one of the plurality of fin apertures and spaced apart from the microelectromechanical structure so as to define a fluid gap therebetween. The fluid gap is configured to provide squeeze film damping of vibrations imparted upon the MEMS structure in at least two dimensions. A frame surrounds the microelectromechanical structure, and a plurality of springs are coupled to the microelectromechanical structure and to the frame.

U.S. Pat. No. 9,227,835 teaches a vibration isolation interposer die including an interposer chip having a base portion and a chip mounting portion. The base portion includes projections extending toward the chip mounting portion, and the chip mounting portion includes projections extending toward the base portion.

SUMMARY

According to one embodiment, a microelectromechanical vibration and stress isolation system is provided. An isolation platform is configured to support a transducer. The isolation platform has a perimeter including a first outer edge surface and a second outer edge surface. A frame surrounds the isolation platform and has a plurality of inner edge surfaces including a first inner edge surface aligned with and spaced from the first outer edge surface, and a second inner edge surface aligned with and spaced from the second outer edge surface. A spring connects the isolation platform to the frame. The spring is L-shaped and has a first leg and a second leg each having substantially similar lengths. The spring extends from the first outer edge surface of the isolation platform and connects to the second inner edge surface of the frame.

The spring may have a spring constant that is substantially similar in an x-direction, a y-direction, and a z-direction. In another embodiment, the spring has a spring constant in an x-direction, a y-direction, and a z-direction, in which the spring constant in two of the directions is substantially similar to one another and different than the spring constant in a third of the directions.

The spring may extend around a corner of the perimeter from the first outer edge surface of the platform to the second inner edge surface of the frame.

The spring may include a first linear leg extending along a direction of and disposed between the first inner edge surface and the first outer edge surface. The spring may include a second linear leg extending along extending along a direction of and disposed between the second inner edge surface and the second outer edge surface. The second linear leg may have a length that exceeds a length of the second outer edge surface of the isolation platform.

One or more additional springs may be provided, wherein each spring connects the isolation platform to the frame while extending around a respective corner of the isolation platform. The springs may collectively provide vibrational attenuation between the frame or outside environment and the isolation platform in three dimensional directions (i.e., x-direction, y-direction, and z-direction).

One or more accelerometers may be mounted on the isolation platform and may be configured to output data used for further vibration attenuation.

The springs may reduce stresses transmitted to and/or from the frame.

The transducer may include at least one of a timing reference, a quartz crystal, an optical sensor, a die/packaged chip, a printed circuit board, or any type of sensor configured to detect motion or orientation.

Shock stops may also be provided, spaced from the isolation platform to inhibit displacement of the isolation platform in all three dimensional directions.

According to another embodiment, a vibration and stress isolation system includes an isolation platform that is configured to support a device. The isolation platform has a perimeter that includes two outer edge surfaces that intersect at a corner. A frame connects to and supports the isolation platform. A spring has a first leg coupled to the isolation platform, a second leg coupled to the frame, and an intermediate portion between the first and second legs that wraps around the corner.

According to another embodiment, a vibration and stress isolation system includes an isolation platform configured to support a transducer. The isolation platform has a perimeter. A frame connects to and supports the isolation platform. A spring connects the isolation platform to the frame. The spring has a first leg extending from the isolation platform and a second leg extending from the frame. The first and second legs cooperate to wrap the spring around at least a portion of the perimeter.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

References below are made to a "controller," a "microprocessor," a "processor," a "signal processor," and a CPU. It should be understood that all of these terms can more broadly be referred to as a "controller." The controller is not a generic controller, but can be specifically programmed to receive signals from a transducer within a MEMS packaged unit, and output data to accomplish various specific tasks in which minute acceleration, speed, temperature, and other readings are desired.

This disclosure provides various embodiments of vibration and stress (e.g., shock, heat, etc.) isolation systems and methods, and more particularly, systems and methods of isolating small (e.g., micro) devices and/or packages from external vibration and stress. One example of a small device is an inertial measurement unit (IMU) such as an accelerometer, a gyroscope, or a magnetometer. Included with the IMU can be a transducer which is a device that converts variations of a physical quantity, such as temperature or acceleration, into an electrical signal for use by a controller. The transducer may be part of or communicatively coupled to a timing reference, quartz crystal, an optical sensor, a die/packaged chip, a printed circuit board, or any type of sensor configured to detect motion or orientation within the packaged unit. In certain applications, output of these sensors is required to be extremely accurate. Any external vibration or stress should be dampened to maintain the accuracy of the device.

Embodiments described below include a frame that supports a suspended platform that supports the device within a package, such as a micropackage. The platform is suspended via suspensions, legs, springs, tethers, etc. (hereinafter referred to as "springs") that hold the platform suspended within the frame while being coupled to the frame. The springs work to dampen the external vibrations and stresses and reduce the impact of those forces on the device that is held on the platform.

Figure 1:
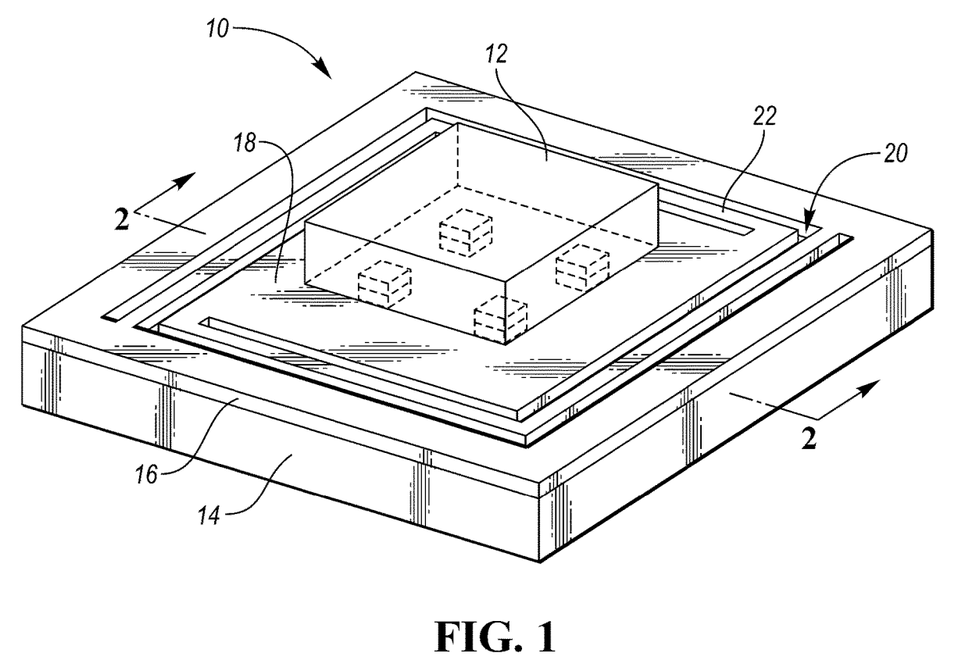
FIG. 1 is a perspective view of a vibration and stress isolation system having a platform suspended within a frame by springs, according to one embodiment.

Referring to FIG. 1, one embodiment of a vibration and stress isolation system 10 is provided for small devices such as MEMS devices 12. A supporting substrate 14, such as a silicon or ceramic or metal (or the like) substrate, is provided as a lower support. A thin layer of a glass or silicon, generally referred to as an isolation substrate or isolating substrate 16 (e.g., wafer or layer), is bonded to the supporting substrate 14. A platform 18 is provided within a central or interior region of the isolating substrate 16. The platform 18 can be co-planar with the remainder of the isolating substrate 16. The isolating substrate 16 can be etched to create openings 20 that separate the platform 18 from the remainder of the isolating substrate 16. The supporting substrate 14 and the portions of the isolating substrate 16 that do not include the platform 18 can be referred to as the frame. Within the openings 20, one or more springs 22 can be provided to connect the platform 18 to the frame. This suspends the platform 18 within the frame, providing thermal and mechanical (e.g., vibrational) isolation between the platform 18 and the frame. The device 12, such as one of the devices described above, can be provided on the platform, such that the device 12 is thermally and mechanically isolated from the frame.

Figure 2:
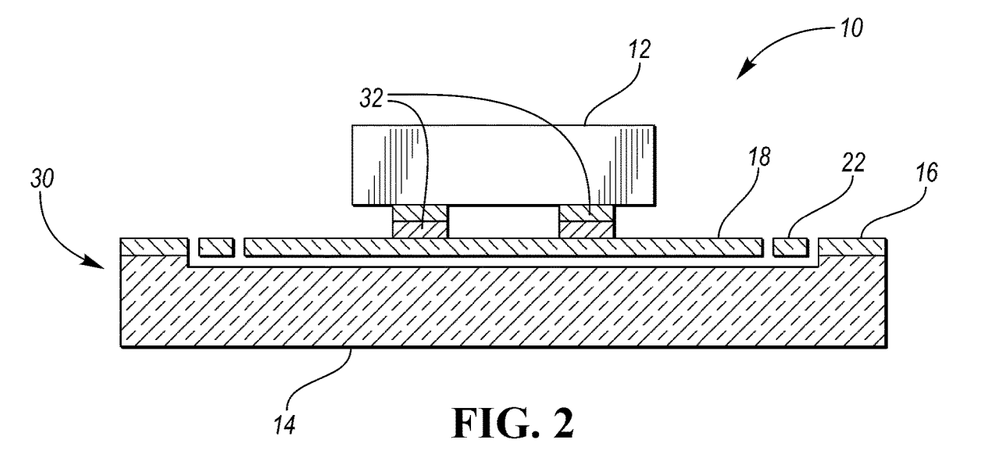
FIG. 2 is a cross-sectional view of the vibration and stress isolation system taken along line 2-2 of FIG. 1, according to one embodiment.

FIG. 2 shows a cross-sectional view of the exemplary system 10. The platform 18 is suspended from the frame 30 by springs 22. The device 12 can be attached to the platform 18 using conductive epoxy 32. In other embodiments, the device is surface-mounted to the platform with various other attachment methods. The springs may have interconnect lines running over them to electrically connect the device 12 to pins or other connection points outside of the platform 18, such as on the frame 30.

Although not shown in the figures, a cap or capsule for vacuum/hermetic encapsulation can be provided over the isolating substrate and/or the platform as part of the system 10.

Prior art isolation platforms inadequately dampen vibration and stresses. Prior art designs of packaged devices (e.g., MEMS devices) include, for example, short projections that extend directly from the platform to the frame. Fins can also be provided with gaps therebetween to allow squeeze film damping. However, the combination of these projections and squeeze film dampening is limited in its potential for dampening vibrations and stresses, particularly in all three dimensional directions (X, Y, and Z).

Accordingly, this disclosure provides various embodiments of springs that connect the platform to the frame, suspend the platform, and also dampen vibrations and stresses. The springs are specifically designed to dampen in all three directions. Utilizing the springs of this disclosure can remove the need for several fins between the platform and frame for squeeze film damping.

FIGS. 3A-3D show various designs for the springs to connect the platform 18 to the frame 30. Each of these springs are generally L-shaped, extend along the gap between the platform 18 and frame 30, while suspending the platform 18 within the frame.

Figure 3A:
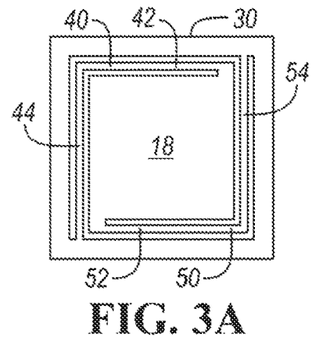
FIGS. 3A-3D are top plan schematic views various embodiments of spring designs for supporting the platform and improving the vibration and stress isolation of the system.

FIG. 3A shows a first spring 40 and a second spring 50. The first spring 40 has a first leg that extends from a connection point at a first corner (i.e., top right corner in the Figure) of the platform 18. A second leg 44 of the spring 40 then extends from the first leg 42 and connects to the frame 30. By doing so, the spring wraps around a second corner (i.e., top left corner), and connects to the frame 30 at a third corner (i.e., bottom left). The second springs 50 connects the platform 18 to the frame in similar fashion but from opposite corners. This spring design of FIG. 3A is similar to that shown in FIG. 1.

Figure 3B:
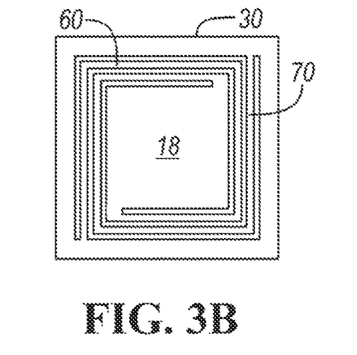

FIG. 3B shows a first spring 60 that extends from a connection point at a corner (i.e., bottom left corner in the Figure) of the platform, wraps around the other three corners of the platform 18, and connects to the frame 30 at a spot adjacent to the connection to the platform 18. A second spring 70 connects the platform 18 to the frame 30 in similar fashion, but has connection points at opposing corners from the first spring 60. In this design, at any point across the gap between the platform 18 and the frame 30, both of the springs 60, 70 are present.

Figure 3C:
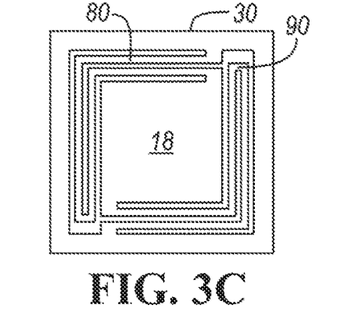

FIG. 3C shows a first spring 80 that extends from a connection point at a first corner (i.e., top right corner in the Figure) of the platform 18, wraps around a second corner (i.e., top left corner), and folds back on itself to return back to the first corner, whereupon the spring is attached to the frame 30. The spring 80 therefore has a first connection point to the platform 18 and a second connection point to the frame 80 that are generally across from one another, across the gap between the platform 18 and the frame 30. A second spring 90 connects the platform 18 to the frame 30 in similar fashion, but has connection points at an opposite corner from the first spring 80.

Figure 3D:
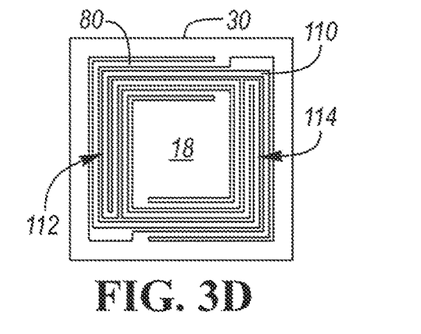

FIG. 3D shows a first spring 100 that extends from a connection point at a first corner (i.e., top right corner in the Figure) of the platform 18, wraps around the other three corners of the platform 18, folds back upon itself and returns back to the first corner, whereupon the spring is attached to the frame 30. The spring 100 therefore has a first connection point to the platform 18 and a second connection point to the frame 80 that are generally across from one another, across the gap between the platform 18 and the frame, while wrapping around three corners of the platform 18. A second spring 110 connects the platform 18 to the frame 30 in similar fashion, but has connection points at an opposite corner from the first spring 100. Also, as seen in FIG. 3D, each spring has regions that are wide enough to receive the other spring, and regions that are narrow to be received in the other spring. For example, at region 112, the second spring 110 is received within the first spring 100, and at region 114, the first spring 100 is received within the second spring 110. In this design, at the majority of points across the gap between the platform 18 and the frame 30, two legs from each of the springs 100, 110 are present.

Figure 4A:
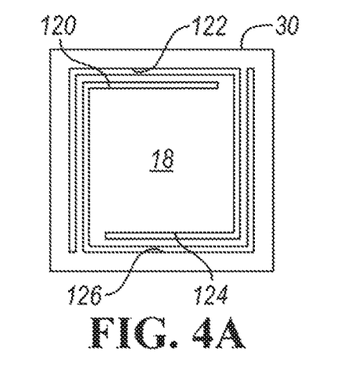
FIGS. 4A-4D are top plan schematic views of additional embodiments of spring designs for supporting the platform and improving the vibration and stress isolation of the system.

FIGS. 4A-4D show additional views of spring designs according to various embodiments of this disclosure. Referring to FIG. 4A, the springs 40, 50 are similar to those shown in FIG. 3A. The platform 18 has a perimeter that includes a plurality of outer edge surfaces, including a first outer edge surface 120. The frame 30 has a plurality of inner edge surfaces that face the platform 18, including a first inner edge surface 122 that faces the first outer edge surface 120. The platform also has a second outer edge surface 124 that faces a second inner edge surface 126 of the frame 30. The first spring 40 connects to the platform 18 at the first outer edge surface 120, wraps around a corner of the platform 18, and connects to the second inner edge surface 126 of the frame 30. The other spring 50 connects the platform 18 at the second outer edge surface 124, wraps around another corner of the platform 18, and connects to the first inner edge surface 122 of the frame 30.

Figure 4B:
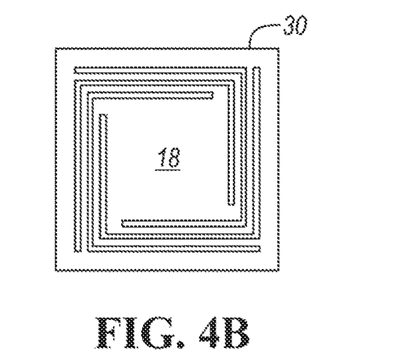

FIG. 4B shows a system design that is similar to FIG. 4A, except that four springs are provided. Each spring extends from one of the outer edge surfaces of the platform, and connects to one of the inner edge surfaces of the frame 30.

Figure 4C:
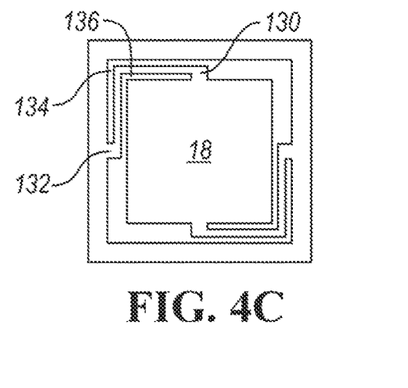

FIG. 4C shows a spring designed with a shortened length for each leg, while still wrapping around a corner of the platform 18 to provide proper dampening in multiple dimensional directions. In this embodiment, similar to other embodiments, each spring has a first leg 130 connected to or adjacent to the platform 18, a second leg 132 connected to or adjacent to the frame 30, and an intermediate portion 134 that wraps around a corner 136 of the platform.

Figure 4D:
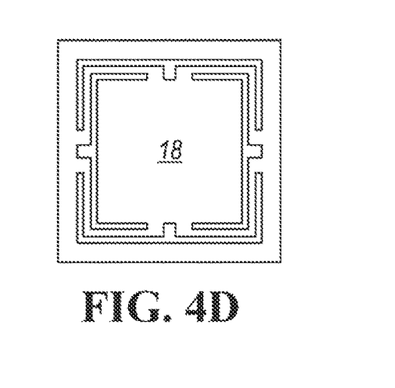

FIG. 4D shows a system design that is similar to FIG. 4C, except that four springs are provided. Each spring has a first leg connected to or adjacent to a central region of an outer edge surface of the platform 18, a second leg connected to or adjacent to a central region of an inner edge surface of the frame 30, and an intermediate region that wraps around a corner of the platform. In this fashion, each corner has a single individual spring that wraps around the corner.

In each of the embodiments of FIGS. 3A-3D and 4A-4D, each vibration and stress isolation system includes multiple springs in which each spring wraps around at least one corner of the platform. By extending around the corner of the platform and extending along a large portion of the gap between the platform and the frame, the springs are able to provide dampening in all three dimensional directions (x-direction, y-direction, and z-direction).

Furthermore, each of the springs of FIGS. 3A-3D and 4A-4D are generally L-shaped, in that they each include a first and second leg that intersect to form the shape of an "L". In one embodiment, at least two of the legs of the spring are equal or at least substantially similar in length. Unlike prior art springs, this, in combination with wrapping around a corner of the platform, allows tuning of the stiffness in all three axes independently while maintaining space efficiency. Tuning the stiffness can be used to control the resonant frequency for each axis.

FIGS. 5A-5C and 6 will now be described and are related to a rounded or circular platform with a corresponding circular frame. Each figure shows a vibration and stress isolation system with a rounded platform 118 that is connected to a frame 130 having a circumference that exceeds that of the platform 118. In these embodiments, rounded or arcuate springs 122 are illustrated. Each spring 122 is rounded with an arc that extends between the arc-shaped gap that exists between the platform 118 and the frame 130.

Figure 5A:
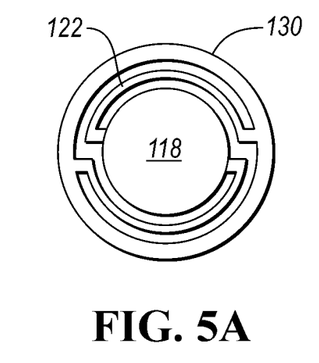
FIGS. 5A-5C are top plan schematic views of additional embodiments of spring designs for supporting a circular platform and improving the vibration and stress of the system.

FIG. 5A shows two rounded springs 122. Each spring is located in a designated hemisphere of the system. In one embodiment, the spring 122 extends from the platform 118, curves 180 degrees about the platform 118 where it is connected to the frame 130. The springs 122 each can extend slightly less than 180 degrees about the platform 118 to accommodate the other spring. Each spring 122 is rounded with an arc that extends between the arc-shaped gap that exists between the platform 118 and the frame 130.

Figure 5B:
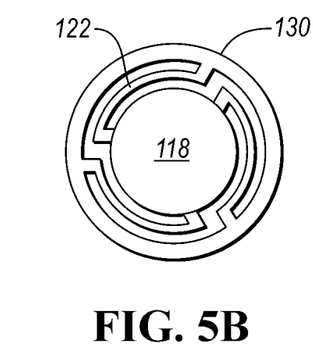
Figure 5C:
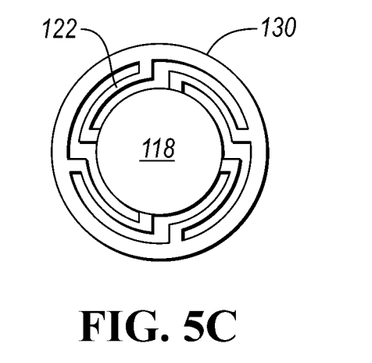

FIG. 5B shows an embodiment in which three springs 122 are shown, each spring extending 120 degrees about the platform 118 to connect to the frame 130 at three equidistant points. FIG. 5C shows an embodiment in which four springs 122 are shown, each spring extending roughly 90 degrees about the platform 118 to connect to the frame 130 at four equidistant points. In this embodiment, each spring 122 is located in a designated quadrant of the system.

Figure 6:
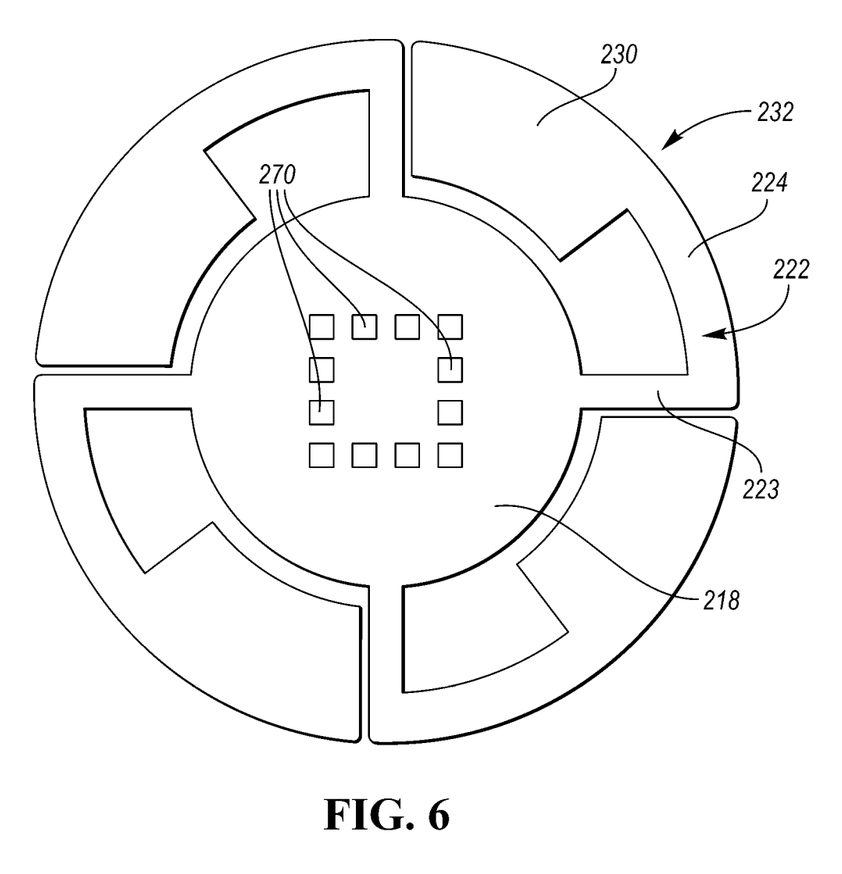
FIG. 6 is a top plan view of one embodiment of a circular frame and integral springs for the platform.

FIG. 6 shows a vibration and stress isolation system having a plurality of springs 222 that have a first leg 223 that extends linearly or radially away from the central platform 218, and a second leg 224 that extends in an arc about a portion of the perimeter of the system to connect to the frame 230. The frame 230 is a segmented frame broken up into four segments 232, according to one embodiment. Each segment is separated from an adjacent segment by one of the first legs 223, wherein each first leg 223 extends along a gap between two adjacent segments 232. Each second leg 223 and each segment 232 cooperate to define a perimeter of the system.

The first leg 223 extends linearly, and the second leg 224 extends directly from the first leg 223 in an arcuate shape. Thus, the springs 222 of this embodiment can also be referred to as generally L-shaped.

Mounting pads 270 may be provided for mounting and/or electrically connecting the devices (e.g., gyroscope, accelerometer, IMU, other timing reference device, quartz crystal, etc.) to the vibration and isolation system.

It should be understand that the orientation of the Figures above is only exemplary. For example, in another embodiment, the frame and platform may be in the reversed orientation such that the frame is interior of the platform that surrounds the frame.

Figure 7:
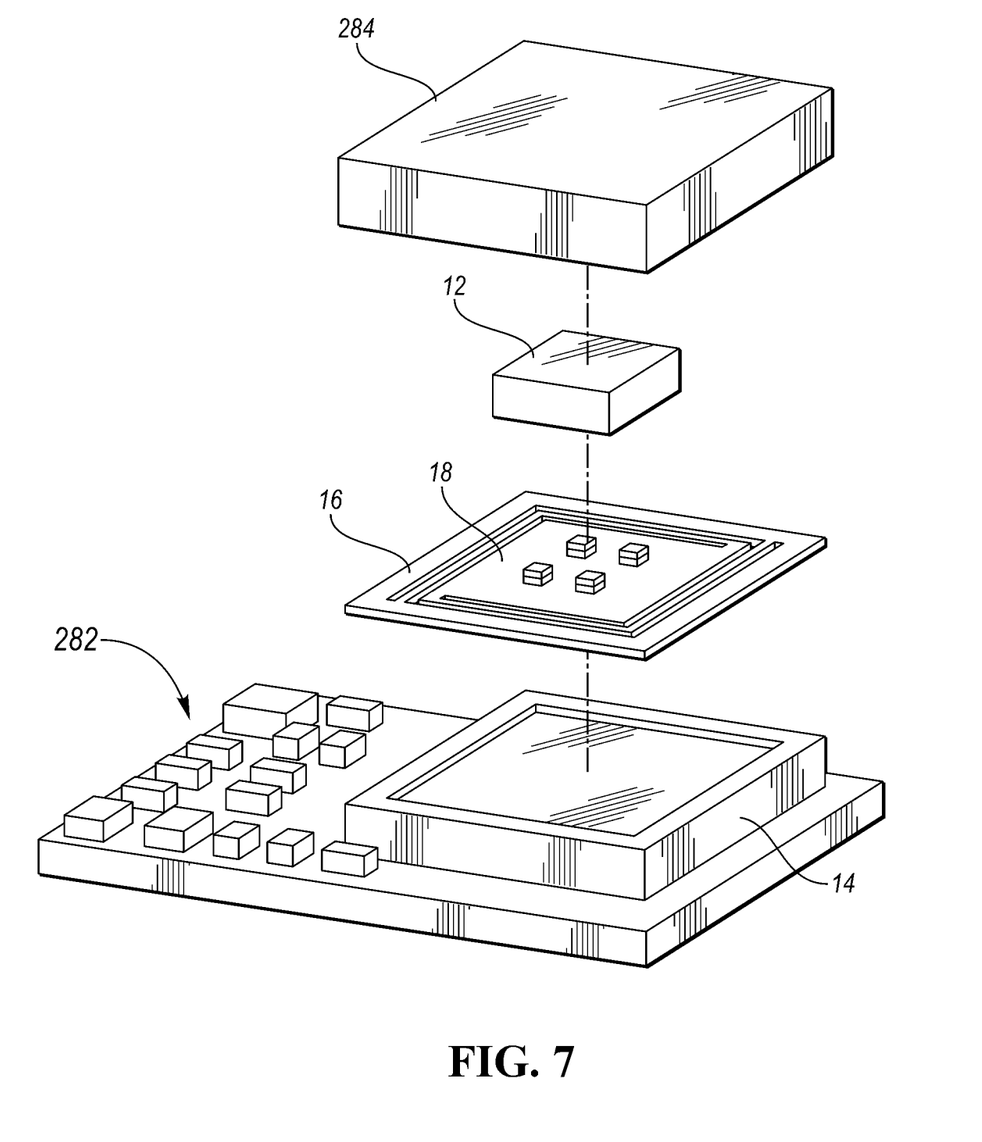
FIG. 7 is an exploded perspective view of an assembly that includes the vibration and stress isolation system as part of a larger overall system on a printed circuit board, according to one embodiment.

FIG. 7 shows a perspective view of an assembly that includes the vibration and stress isolation system as part of an overall system. A device (such as those listed above, for example) 12 is mounted to the platform 18. The system and the device 12 may be held above a printed circuit board (PCB) 282 that includes an oscillator circuit, controlling circuit, or compensation circuit. A cap 284 is placed over the system and device 12 to further isolate them from the environment.

In the embodiments described above, the spring may be tuned and manufactured to have a spring constant that is substantially similar in an x-direction, a y-direction, and a z-direction. In other embodiments, the spring is tuned and manufactured to have a spring constant in two of the directions being substantially similar to one another and different than the spring constant in a third of the directions. These spring constants, in combination with the generally L-shape spring designs that wrap around a corner portion of the platform, have been shown to yield an improved dampening system. For example, the shape of the springs allow 100 times more flexible in all three-axis directions when compared to some conventional vibrational dampening systems for MEMS devices. The increased flexibility allows for the design of a 30-150 Hz resonant frequency vibration isolation systems for devices with mass. (For example, the mass of the PCB may be approximately 0.1-10 grams). Furthermore, the springs may only be approximately 0.1-2 mm thick, allowing it to be stacked underneath the PCB for an ultra-compact assembly.

Figure 8A:
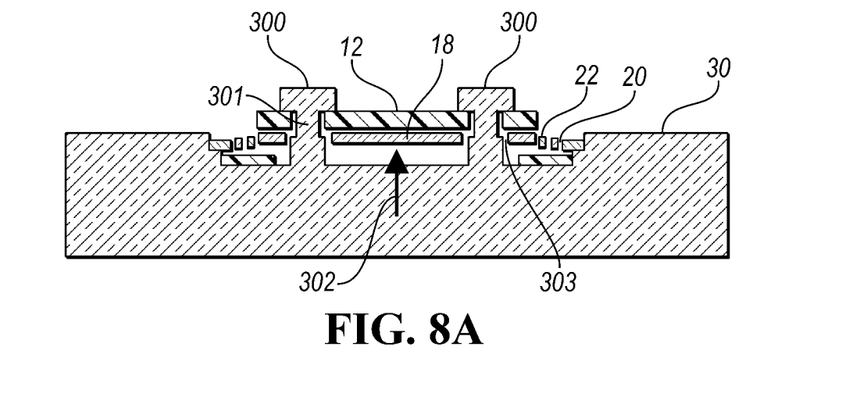
FIGS. 8A-8C are cross-sectional views of a vibration and stress isolation system having shock stops, according to one embodiment.
Figure 8B:
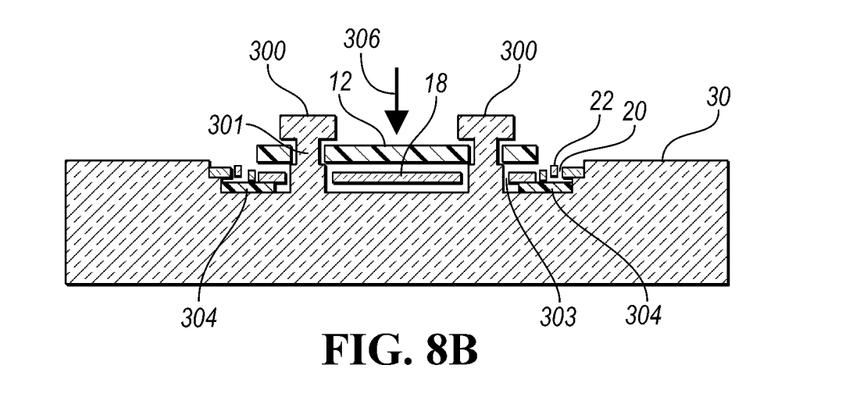
Figure 8C:
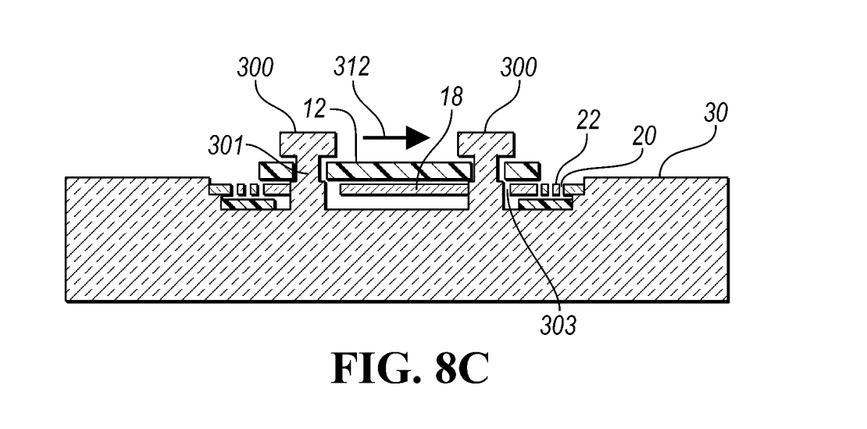

FIGS. 8A-8C show cross-sectional schematic views of the vibration and stress isolation system, in which the system is provided with various shock stops. The shock stops are fixed in various locations to limit the maximum displacement of the suspended platform (e.g., platform 18) when the platform is subject to large amounts of force. FIGS. 8A-8C each show the isolation platform 18 connected to the frame 30 via springs 22, as well as the device 12 (such as PCB or MEMS devices) being held above the platform 18.

FIG. 8A highlights shock stops 301 that limit the upward (positive z-directional) movement of the platform 18. The shock stops 301 include a plurality of pillars 301 that extend between the platform 18 and device 12, including a top 300 of the shock stop. In one embodiment, the pillars 301 can be assembled to the system after the openings 20 and 303 in the substrate (e.g., silicon, glass, ceramic, etc.) are etched, in which the pillars 301 are fitted through the opening 303. In one embodiment, the device 12 has openings for pillars. In another embodiment, the device 12 has no openings and does not overlap with the location of the pillars. When a large force (indicated by arrow 302) is provided to the platform 18, the springs 22 allow the platform 18 to move upward. The top shock stops 300 limit the upward movement of the platform by contacting the top side of the device 12 or platform.

FIG. 8B highlights bottom shock stops 304 that limit the downward (negative z-directional) movement of the platform 18. The bottom shock stops 304 can be located below the springs 32, and supported by the frame 30. When a large force (indicated by arrow 306) is provided to the platform 18, the springs 22 allow the platform to move downward. The bottom shock stops 304 limit the downward movement of the platform by contacting the underside of the springs 22 or platform 18. The top shock stops 300 and the bottom shock stops 304 cooperate to limit the possible z-directional movement of the platform 18 and associated device.

FIG. 8C highlights side shock stops 301 that limit the side (x- and y-directional) movement of the platform 18. The side shock stops 301 are located laterally between the platform 18 and the springs 22 in the opening 303. When a large force (indicated by arrow 312) is provided to the platform 18, the springs 22 allow the platform to move laterally. The side shock stops 301 limit the lateral movement of the platform by contacting the outer side surfaces of the platform 18 or device 12 as the platform 18 moves laterally. The arrow 312 shows the force acting on the platform 18 toward the right (i.e., positive x-direction), pushing the platform 18 in contact with one of the side shock stops 301.

While not shown in the Figures, the encapsulated system may be filled with a heavy gas, a dense gas, a high-pressure gas or a dampening liquid (e.g., oil) to increase damping. In certain embodiments, gas encapsulated in the system can dampen vibration more effectively than a vacuum or air (e.g., atmosphere).

Also, in another embodiment of the pillars explained in FIGS. 8A-8C, the entire device 12 may be inside of the pillars rather than part of the device extending beyond the boundary of the pillars.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A microelectromechanical vibration and stress isolation system, comprising:
   an isolation platform configured to support a transducer mounted thereto in which the isolation platform is a separate component from but supports the transducer, the isolation platform including a transducer-mounting surface on one side thereof configured to provide a mounting surface for the transducer, and an unsupported surface on an opposite side thereof, the isolation platform having a perimeter including a first outer edge surface and a second outer edge surface;
   a frame surrounding the isolation platform and having a plurality of inner edge surfaces including a first inner edge surface aligned with and spaced from the first outer edge surface, and a second inner edge surface aligned with and spaced from the second outer edge surface; and
   a spring connecting the isolation platform to the frame, wherein the spring and the isolation platform and the frame all have a common thickness, the spring being L-shaped and having a first leg and a second leg each having substantially similar lengths, the spring extending from the first outer edge surface of the isolation platform and connecting to the second inner edge surface of the frame.

2. The system of claim 1, wherein the spring has a spring constant that is substantially similar in an x-direction, a y-direction, and a z-direction.

3. The system of claim 1, wherein the spring has a spring constant in an x-direction, a y-direction, and a z-direction, the spring constant in two of the directions being substantially similar to one another and different than the spring constant in a third of the directions.

4. The system of claim 1, wherein the spring extends around a corner of the perimeter from the first outer edge surface of the isolation platform to the second inner edge surface of the frame.

5. The system of claim 1, wherein the spring includes a first linear leg extending along a direction of and disposed between the first inner edge surface and the first outer edge surface.

6. The system of claim 5, wherein the spring includes a second linear leg extending along extending along a direction of and disposed between the second inner edge surface and the second outer edge surface.

7. The system of claim 6, wherein the second linear leg has a length that exceeds a length of the second outer edge surface of the isolation platform.

8. The system of claim 1, further comprising one or more additional springs, wherein each spring connects the isolation platform to the frame while extending around a respective corner of the isolation platform.

9. The system of claim 8, wherein the springs collectively provide vibrational attenuation between the frame or outside environment and the isolation platform in three dimensions.

10. The system of claim 8, wherein one or more accelerometers are mounted on the isolation platform and are configured to output data used for further vibration compensation.

11. The system of claim 8, wherein the springs reduce stresses transmitted to and/or from the frame.

12. The system of claim 1, wherein the transducer includes at least one of a timing reference, quartz crystal, an optical sensor, a die/packaged chip, a printed circuit board, or any type of sensor configured to detect motion or orientation.

13. The system of claim 1, further comprising shock stops spaced from the isolation platform to inhibit displacement of the isolation platform in an x-direction, a y-direction, and a z-direction.

14. A vibration and stress isolation system, comprising:
   an isolation platform configured to support a device mounted thereto in which the isolation platform is a separate component from but supports the device, the isolation platform including a device-mounting surface on one side thereof configured to provide a mounting surface for the device, and an unsupported surface on an opposite side thereof, the isolation platform having a perimeter that includes two outer edge surfaces that intersect at a corner;
   a frame connected to and supporting the isolation platform; and
   a spring having a first leg coupled to the isolation platform, a second leg coupled to the frame, and an intermediate portion between the first and second legs that wraps around the corner, wherein the spring and the isolation platform and the frame all have a common thickness.

15. The system of claim 14, wherein the spring has a spring constant that is substantially similar in an x-direction, a y-direction, and a z-direction.

16. The system of claim 14, wherein the spring has a spring constant in an x-direction, a y-direction, and a z-direction, the spring constant in two of the directions being substantially similar to one another and different than the spring constant in a third of the directions.

17. The system of claim 14, wherein the two outer edge surfaces includes a first outer edge surface and a second outer edge surface, the frame includes a first inner edge surface aligned with and spaced from the first outer edge surface, the frame further includes a second inner edge surface aligned with and spaced from the second outer edge surface, and the spring connects the first outer edge surface of the isolation platform to the second inner edge surface of the frame.

18. The system of claim 17, wherein the first and second legs cooperate to define the spring as being L-shaped that extends around the corner from the first outer edge surface of the isolation platform to the second inner edge surface of the frame.

19. The system of claim 18, wherein the L-shaped spring includes a first linear leg extending along a direction of and disposed between the first inner edge surface and the first outer edge surface, and wherein the L-shaped spring includes a second linear leg extending along extending along a direction of and disposed between the second inner edge surface and the second outer edge surface.

20. The system of claim 19, wherein the second linear leg has a length that exceeds a length of the second outer edge surface of the isolation platform.

21. The system of claim 14, further comprising one or more additional springs, wherein each spring connects the isolation platform to the frame while wrapping around a respective corner of the isolation platform.

22. The system of claim 21, wherein one or more accelerometers are mounted on the isolation platform and are configured to output data used for further vibration compensation.

23. The system of claim 21, wherein the springs reduce stresses transmitted to and/or from the frame.

24. The system of claim 14, wherein the device is at least one of a timing reference, quartz crystal, an optical sensor, a die/packaged chip, a printed circuit board, or any type of sensor configured to detect motion or orientation.

25. The system of claim 14, further comprising shock stops spaced from the isolation platform to inhibit displacement of the isolation platform in an x-direction, a y-direction, and a z-direction.

26. A vibration and stress isolation system, comprising:
an isolation platform configured to support a transducer mounted thereto in which the isolation platform is a separate component from but supports the transducer, the isolation platform including a transducer-mounting surface on one side thereof configured to provide a mounting surface for the transducer, and an unsupported-surface on an opposite side thereof, the isolation platform having a perimeter;
a frame connected to and supporting the isolation platform; and
a spring connecting the isolation platform to the frame, the spring having a first leg extending from the isolation platform and a second leg extending from the frame, wherein the first and second legs cooperate to wrap the spring around at least a portion of the perimeter, and wherein the spring and the isolation platform and the frame all have a common thickness.

27. The system of claim 26, wherein the spring has a spring constant that is substantially similar in an x-direction, a y-direction, and a z-direction.

28. The system of claim 26, wherein the spring has a spring constant in an x-direction, a y-direction, and a z-direction, the spring constant in two of the directions being substantially similar to one another and different than the spring constant in a third of the directions.

29. The system of claim 26, wherein the isolation platform is generally circular and second leg is arcuate.

30. The system of claim 29, wherein the first leg is linear.

31. The system of claim 26, wherein the spring is L-shaped.

32. The system of claim 31, wherein the second leg extends directly from the first leg.

33. The system of claim 26, wherein the spring further includes a third leg and a fourth leg that extend between and connect the first leg to the second leg, wherein the third leg extends perpendicularly from first leg, and the fourth leg extends perpendicularly from the second leg, wherein the third and fourth legs do not extend directly from either the isolation platform or the frame.

34. The system of claim 26, further comprising three additional springs, wherein each spring connects the isolation platform to the frame while wrapping around a respective portion of the isolation platform.

35. The system of claim 26, wherein the first leg and the second leg perpendicularly intersect one another and each have a substantially similar length.

36. The system of claim 26, wherein one or more accelerometers are mounted on the isolation platform and are configured to output data used for further vibration compensation.

37. The system of claim 26, wherein the springs reduce stresses transmitted to and/or from the frame.

38. The system of claim 26, wherein the transducer includes at least one of a timing reference, quartz crystal, an optical sensor, a die/packaged chip, a printed circuit board, or any type of sensor configured to detect motion or orientation.

39. The system of claim 26, further comprising shock stops spaced from the isolation platform to inhibit displacement of the isolation platform in an x-direction, a y-direction, and a z-direction.

* * * * *